(12) United States Patent
Imoto et al.

(10) Patent No.: US 10,722,979 B2
(45) Date of Patent: Jul. 28, 2020

(54) BONDING METHOD AND BONDING DEVICE FOR METAL MEMBER

(71) Applicant: JTEKT CORPORATION, Osaka-shi (JP)

(72) Inventors: Yoshinori Imoto, Kariya (JP); Takaya Nagahama, Obu (JP); Koichi Shiiba, Nisshin (JP)

(73) Assignee: JTEKT CORPORATION, Osaka-shi (JP)

( * ) Notice: Subject to any disclaimer, the term of this patent is extended or adjusted under 35 U.S.C. 154(b) by 510 days.

(21) Appl. No.: 15/481,050

(22) Filed: Apr. 6, 2017

(65) Prior Publication Data
US 2017/0291259 A1      Oct. 12, 2017

(30) Foreign Application Priority Data
Apr. 12, 2016   (JP) ................. 2016-079730

(51) Int. Cl.
*B23K 26/211*  (2014.01)
*B23K 26/323*  (2014.01)
(Continued)

(52) U.S. Cl.
CPC .......... *B23K 26/211* (2015.10); *B23K 26/032* (2013.01); *B23K 26/0626* (2013.01); *B23K 26/244* (2015.10); *B23K 26/323* (2015.10); *B23K 26/34* (2013.01); *B23K 26/60* (2015.10); *B23K 26/707* (2015.10); *C23C 26/00* (2013.01); *H01L 21/4825* (2013.01);
(Continued)

(58) Field of Classification Search
CPC .............. B23K 26/032; B23K 26/034; B23K 26/0626; B23K 26/211; B23K 26/244; B23K 26/323; B23K 26/324; B23K 26/34; B23K 26/60; B23K 26/707

USPC ........... 219/121.63, 121.64, 121.65, 121.66, 219/121.67, 121.68, 121.69, 121.7, 219/121.71, 121.72, 121.85; 438/126, 438/662, 705, 708, 771, 788, 795
See application file for complete search history.

(56) References Cited

U.S. PATENT DOCUMENTS

| | | | |
|---|---|---|---|
| 2009/0120915 A1* | 5/2009 | Tagawa | B23K 26/032 219/121.62 |
| 2013/0134139 A1* | 5/2013 | Duerr | B23K 26/0622 219/121.63 |
| 2014/0090976 A1* | 4/2014 | Rotschild | H01G 9/2068 204/267 |

FOREIGN PATENT DOCUMENTS

| | | |
|---|---|---|
| JP | 4894528 | 3/2012 |
| JP | 5602050 | 10/2014 |
| JP | 2014-228478 | 12/2014 |

* cited by examiner

*Primary Examiner* — Ibrahime A Abraham
*Assistant Examiner* — Justin C Dodson
(74) *Attorney, Agent, or Firm* — Oblon, McClelland, Maier & Neustadt, L.L.P.

(57) ABSTRACT

A bonding method includes: an oxide-film forming step, on an irradiated surface, an oxide film having a film thickness corresponding to a first output and an irradiation time of an oxide-film-forming laser beam; a first reflected-laser-beam detection step of detecting a second output; a first absorptance computing step of computing a first absorptance for the oxide-film-forming laser beam; laser-beam switching step of switching the oxide-film-forming laser beam radiated onto the irradiated surface to a heat-bonding laser beam; and a heat bonding step of heating a first bonding surface until the temperature thereof reaches a predetermined bonding temperature, and bonding the first bonding surface to a second bonding surface.

17 Claims, 10 Drawing Sheets

(51) Int. Cl.
  *H01L 21/48*   (2006.01)
  *B23K 26/70*   (2014.01)
  *C23C 26/00*   (2006.01)
  *B23K 26/34*   (2014.01)
  *B23K 26/06*   (2014.01)
  *B23K 26/60*   (2014.01)
  *B23K 26/244*  (2014.01)
  *B23K 26/03*   (2006.01)
  *B23K 101/40*      (2006.01)
  *B23K 103/12*      (2006.01)
  *B23K 103/18*      (2006.01)

(52) U.S. Cl.
  CPC ...... *B23K 26/0643* (2013.01); *B23K 2101/40* (2018.08); *B23K 2103/12* (2018.08); *B23K 2103/18* (2018.08)

BONDING METHOD AND BONDING DEVICE FOR METAL MEMBER

CROSS-REFERENCE TO RELATED APPLICATIONS

This application is based upon and claims the benefit of priority from prior Japanese Patent Application No. 2016-079730 filed on Apr. 12, 2016, the entire content of which is incorporated herein by reference.

BACKGROUND OF THE INVENTION

Field of the Invention

The present invention relates to a bonding method and a bonding device for a metal member using a laser beam.

Description of the Related Art

There is a conventional technique in which a metal member is heated by radiating a laser beam onto a surface of the metal member and causing the metal member to absorb the laser beam. See Japanese Patent No. 4894528 (JP 4894528), Japanese Patent No. 5602050 (JP 5602050), and Japanese Patent Application Publication No. 2014-228478 (JP 2014-228478 A), for example. Herein, there are various purposes for heating a metal member. For example, one of such purposes is to bond two members as described in JP 4894528 and JP 5602050. When bonding two members, for example, a metal member (e.g., a lead wire) serving as a contact of an electric circuit is heated, and a member to be bonded (e.g., a semiconductor terminal) and the metal member are directly bonded together. In this case, as described in JP 4894528 and JP 5602050, while a heated portion is kept in a solid-phase state without sufficiently heating the portion to change the state into a liquid-phase state, the metal member and the member to be bonded may be pressed against each other with a predetermined pressure to be bonded together (solid-phase diffusion bonding). Alternatively, bonding may be performed by ordinary welding in which the heated portion is melted to change into the liquid-phase state. By these bonding methods, bonding between the metal member and the member to be bonded can be made stronger in high-temperature conditions than in the case of bonding with solder, for example.

Some of other examples of heating such as that described in JP 2014-228478 A aim to perform non-destructive inspection to determine whether a metal member and a member to be bonded that are already bonded together are in contact with each other with a sufficient area therebetween and bonded together. In the technique of JP 2014-228478 A, a metal member is first heated and the temperature thereof is raised by radiating a laser beam onto the metal member that is bonded to a member to be bonded. At this time, when the metal member and the member to be bonded are in contact with (bonded to) each other with a sufficient area therebetween, the heat for raising the temperature is satisfactorily transferred from the metal member to the member to be bonded, depending on the contact area. Accordingly, the temperature-rising speed of the metal member is low. However, when the metal member and the member to be bonded are not in contact with each other with a sufficient area therebetween and are insufficiently bonded together, the heat of the metal member cannot be satisfactorily transferred toward the member to be bonded, and thus the temperature-rising speed is high. Based on the difference between these temperature-rising speeds, the bonding state between the metal member and the member to be bonded is evaluated.

In the description above, as the radiated laser beam, an inexpensive YAG laser, for example, is generally used in many cases. The YAG laser is a laser the laser beam of which has a near-infrared wavelength (0.7 μm to 2.5 μm). The absorptance of a metal member such as copper (or aluminum) for the laser beam radiated by the YAG laser is very low at low temperature before a predetermined temperature (e.g., a melting point) is reached. Thus, for example, in JP 4894528, JP 5602050, JP 2014-228478 A, when copper (or aluminum) is used for the metal member, the temperature rise of the metal member is slow because the absorptance of the metal member for the laser beam is low even when the laser beam is radiated directly onto the metal member at low temperature. Consequently, much energy is consumed until the predetermined temperature from which the absorptance increases is reached. Not only in copper or aluminum, but also in other metals, generally at low temperature, the temperature rise of the metal member is slower than at high temperature because the absorptance for the laser beam is lower. Consequently, much energy is consumed until the predetermined temperature from which the absorptance increases is reached.

By contrast, in the technique of JP 2014-228478 A, based on conventional knowledge, an oxide film is formed on a surface of a metal member to improve the absorptance of the metal member for a laser beam at low temperature. The oxide film is formed by radiating a laser beam for forming an oxide film onto the surface of the metal member. Specifically, in order to form the oxide film such that the film thickness thereof becomes a predetermined film thickness that enables a predetermined absorptance to be achieved, the laser beam is radiated onto the surface of the metal member for a predetermined period of time. Subsequently, a heating laser beam is radiated onto the metal member through the oxide film thus formed. The temperature of the metal member the absorptance of which for the laser beam is improved by formation of the oxide film is raised quickly, and the bonding state is efficiently evaluated. In JP 2014-228478 A, based on known knowledge that the absorptance for the laser beam becomes saturated when the film thickness of the oxide film increases beyond a certain value, a film thickness at which the absorptance becomes saturated is set, and the irradiation time of the laser beam for enabling this film thickness to be formed is set.

However, it takes too much time to form an oxide film having a thickness that is equal to or larger than a certain film thickness at which the absorptance becomes saturated as described in JP 2014-228478 A, which causes cost increase. When the laser irradiation time is shortened so as to form an oxide film in a short time, the film thickness of the formed oxide film becomes thinner. In this case, a relation between the film thickness of a thin oxide film that can be formed by laser irradiation for a short time and the absorptance of the metal member for the laser beam has periodicity in which a local-maximum value and a local-minimum value alternately appear in a direction in which the film thickness increases beyond zero. In this case, even when variations in film thickness of the formed oxide film are not great and are small, great variations in absorptance occur. Consequently, the absorptance for the laser beam cannot be obtained stably although the cost is low.

SUMMARY OF THE INVENTION

It is an object of the present invention to provide a bonding method and a bonding device for a metal member that can form a thin oxide film at low cost to improve the absorptance for a laser beam, thereby enabling bonding between metal members to be achieved in a short time.

A bonding method according to one aspect of the present invention is a bonding method for bonding a first bonding surface of a first metal member to a second bonding surface of a second metal member that is in contact with the first bonding surface by radiating a heat-bonding laser beam onto an irradiated surface of the first metal member to heat the first bonding surface.

The bonding method includes:
an oxide-film forming step of radiating an oxide-film-forming laser beam at a first output onto the irradiated surface of the first metal member, and forming, on the irradiated surface, an oxide film having a film thickness that corresponds to the first output and an irradiation time of the oxide-film-forming laser beam;
a first reflected-laser-beam detection step of detecting a second output that is an output of a first reflected laser beam generated from the oxide-film-forming laser beam upon being reflected by the irradiated surface;
a first absorptance computing step of computing a first absorptance of the irradiated surface of the first metal member for the oxide-film-forming laser beam, based on the first output of the oxide-film-forming laser beam radiated at the oxide-film forming step and the second output of the first reflected laser beam detected at the first reflected-laser-beam detection step;
a laser-beam switching step of switching the oxide-film-forming laser beam radiated onto the irradiated surface to the heat-bonding laser beam if it is determined that the first absorptance is equal to or higher than a predetermined absorptance; and
a heat bonding step of, after the switching to the heat-bonding laser beam, radiating the heat-bonding laser beam at a third output onto the irradiated surface to heat the first bonding surface until a temperature of the first bonding surface reaches a predetermined bonding temperature, and bonding the first bonding surface to the second bonding surface.

As described above, at the oxide-film forming step, the oxide-film-forming laser beam is radiated onto the irradiated surface of the first metal member. While the oxide film is being formed on the irradiated surface, the first reflected laser beam reflected by the irradiated surface is detected, and the absorptance is computed based on the first output of the oxide-film-forming laser beam and the second output of the first reflected laser beam. In other words, the actual absorptance for the oxide-film-forming laser beam that is achieved by the oxide film formed on the irradiated surface is acquired. When the absorptance for the oxide-film-forming laser beam becomes equal to or higher than the predetermined absorptance, the oxide-film-forming laser beam is switched to the heat-bonding laser beam. The first bonding surface is then heated up to the predetermined bonding temperature at the heat bonding step, whereby the first bonding surface is bonded to the second bonding surface. Thus, even if the irradiation time of the oxide-film-forming laser beam is short and only a thin oxide film can be formed, a desired absorptance can be reliably obtained. In other words, even with a thin oxide film that is formed in a short time at low cost, the desired absorptance can be reliably obtained. Consequently, the heat-bonding laser beam is absorbed by the first metal member with the desired absorptance, and the first bonding surface of the first metal member is heated up to the predetermined bonding temperature in a short time, so that the first bonding surface can be bonded to the second bonding surface in a short time.

BRIEF DESCRIPTION OF THE DRAWINGS

The foregoing and further features and advantages of the invention will become apparent from the following description of example embodiments with reference to the accompanying drawings, wherein like numerals are used to represent like elements and wherein.

DETAILED DESCRIPTION OF EMBODIMENTS

Figure 1:
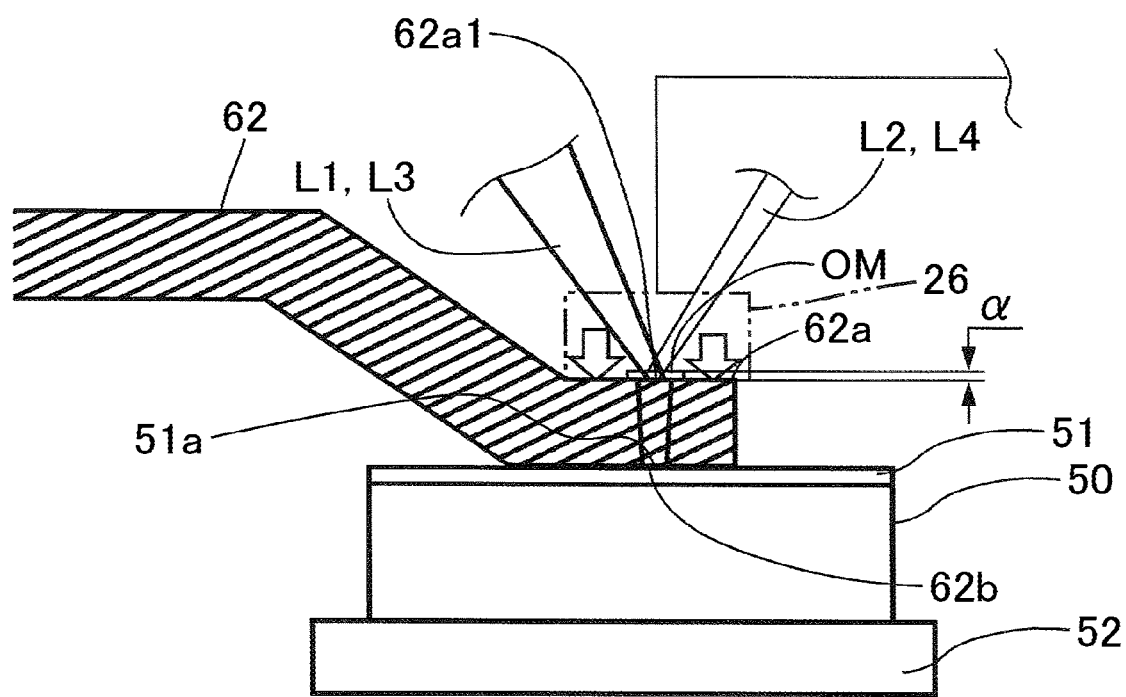
FIG. 1 is an enlarged view of metal members that are bonded together.

An outline of a bonding device according to a first embodiment of the present invention will be described with reference to FIG. 1. The bonding device is a device that bonds two metal members together by radiating a laser beam. As depicted in FIG. 1, in the present embodiment, the two metal members are a first metal member (lead frame 62) formed of copper, for example, and a second metal member (a metal terminal 51 at a surface of a semiconductor component 50) formed of Au, for example.

Specifically, the laser beam is radiated onto an irradiated surface 62a1 in a surface 62a of the lead frame 62. Thus, the lead frame 62 is caused to absorb the radiated laser beam from the irradiated surface 62a1, whereby the lead frame 62 is heated. The temperature of a first bonding surface 62b positioned opposite to the surface 62a of the lead frame 62 is raised to a temperature for enabling bonding.

Thus, the first bonding surface 62b of the lead frame 62 positioned opposite to the surface 62a and a second bonding surface 51a in the upper surface of the metal terminal 51 that is formed as a terminal on the upper surface of the semiconductor component 50 are bonded together. Before being bonded, the first bonding surface 62b and the second bonding surface 51a are in contact with each other. The semiconductor component 50 is supported from its lower surface by a predetermined support member 52.

In the present embodiment, as the laser beam that is radiated onto the irradiated surface 62a1 of the lead frame 62 to heat the first bonding surface 62b, an inexpensive laser beam having a near-infrared wavelength described later in detail is used. For such a laser beam having a near-infrared wavelength, copper that forms the lead frame 62 has a very low absorptance. Thus, there is a problem in that it takes too much time to heat the first bonding surface 62b by radiating the laser beam.

In view of this, in the present invention, in order to solve this problem, an oxide film OM having a film thickness $\alpha 1$ is formed on the irradiated surface 62a1, whereby an absorptance Y for the laser beam having a near-infrared wavelength is increased. As will be described later in detail, the fact that formation of the oxide film OM increases the absorptance for the laser beam in comparison with the case without the oxide film OM is based on known knowledge. In the present embodiment, the oxide film OM is formed by radiating the laser beam having a near-infrared wavelength onto the irradiated surface 62a1.

In the present embodiment, it is assumed that the lead frame 62 and the metal terminal 51 of the semiconductor component 50 are bonded together by known solid-phase diffusion bonding. The solid-phase diffusion bonding is a known bonding method in which, for example, the first bonding surface 62b and the second bonding surface 51a in a solid-phase state are pressed against each other at a pressure P1 in a pressure-bonding direction to be bonded together. The solid-phase state herein is a state that occurs at a temperature lower than the temperature of a liquid-phase state and enables bonding in a solid state, and that can be achieved by, for example, raising the temperature of the first bonding surface 62b of the lead frame 62 (first metal member).

In the solid-phase diffusion bonding, it was found that bonding having high strength can be achieved by keeping the temperature of the first bonding surface 62b to be bonded for a certain period of time at a bonding temperature Ta that is a temperature near the melting point of the lead frame 62, and then pressing the first bonding surface 62b and the second bonding surface 51a against each other in the pressure-bonding direction. The solid-phase diffusion bonding is merely one example of bonding, and the bonding is not limited to this.

Figure 2:
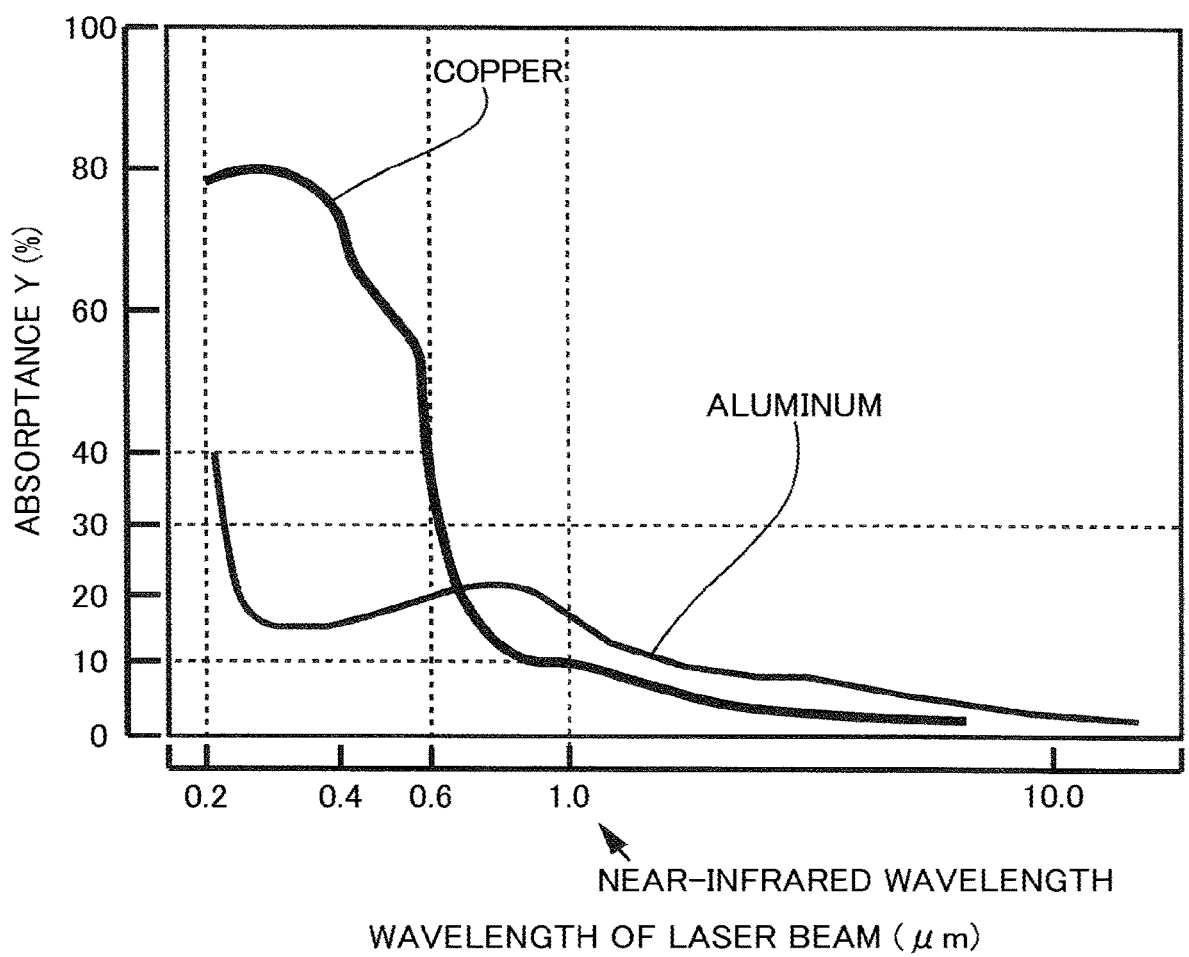
FIG. 2 is a graph illustrating a relation between the wavelength of a near-infrared laser beam and the absorptance by metal material.
Figure 3:
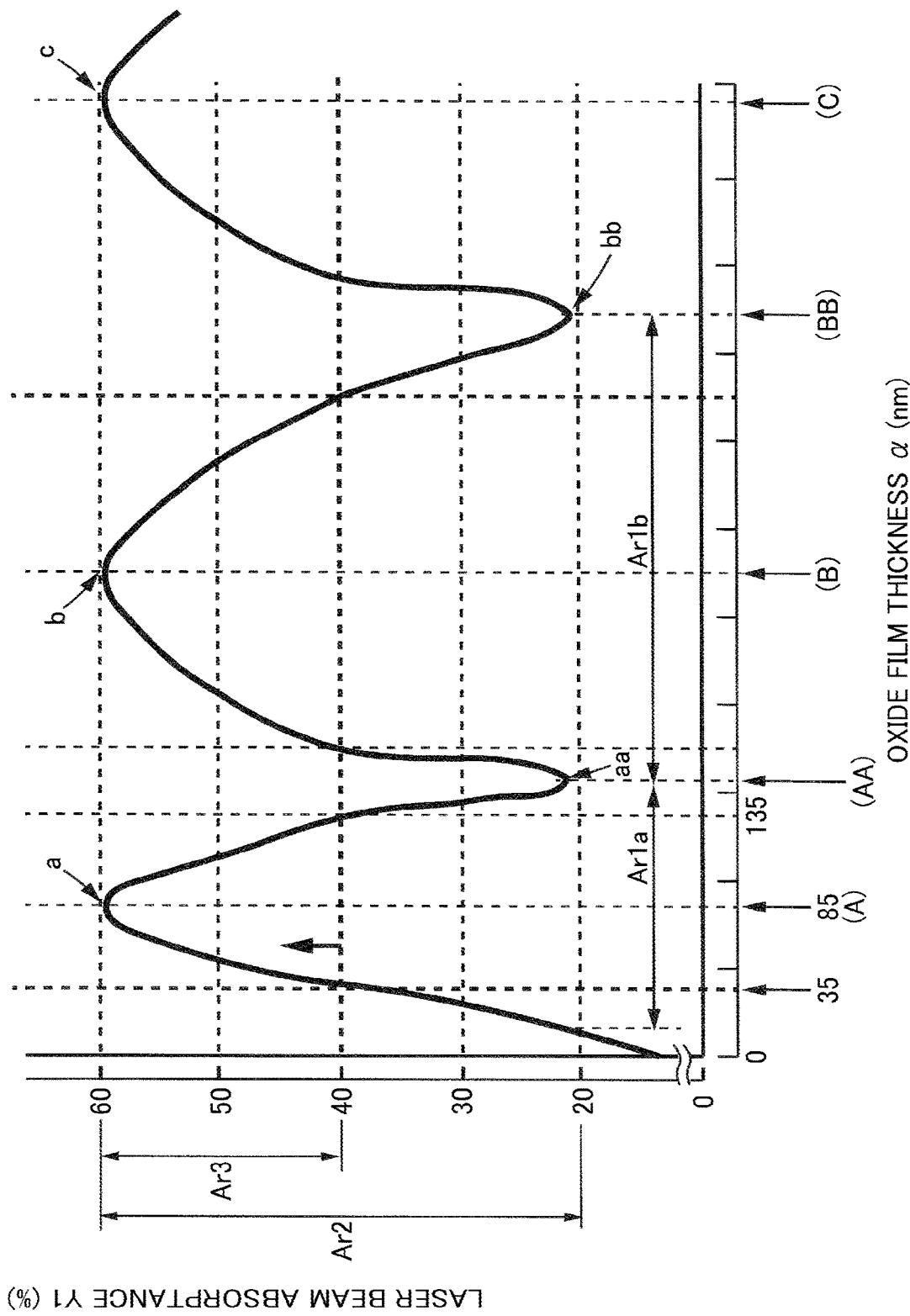
FIG. 3 is a graph illustrating a relation between the thickness of an oxide film and the absorptance for the laser beam.
Figure 4:
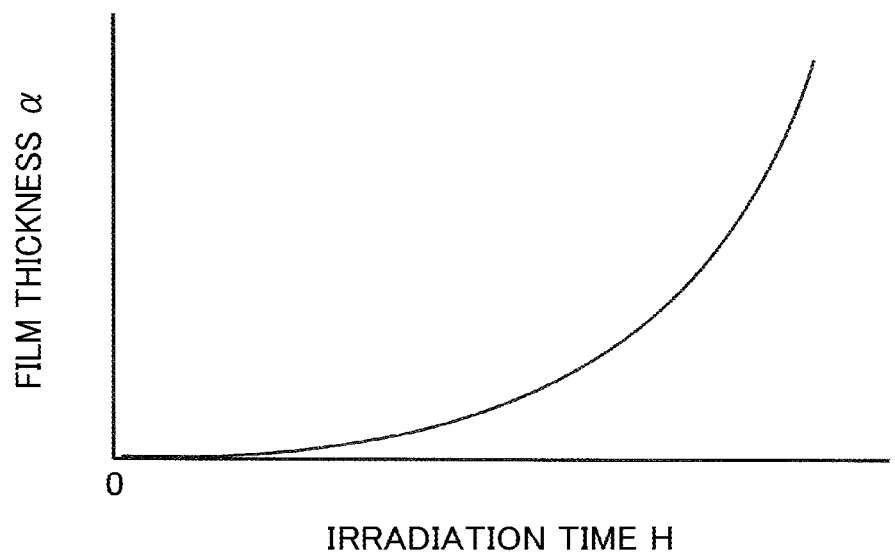
FIG. 4 is a graph illustrating a relation between the film thickness of an oxide film that is formed on a surface of a metal member by irradiation with an oxide-film-forming laser beam and the irradiation time.

The following describes the absorptance for a laser beam with reference to FIG. 2, FIG. 3, and FIG. 4. FIG. 2 is a general graph illustrating a relation between the wavelength of a laser beam and the absorptance of the metal member. As depicted in FIG. 2, in the present embodiment, copper used as the first metal member is a material the absorptance of which for a laser beam having a near-infrared wavelength is very low at room temperature.

It is assumed in the present embodiment that, as the first metal member, a low-absorptance material the absorptance of which for the laser beam having a near-infrared wavelength at room temperature is equal to or lower than a predetermined value is used. The predetermined value of the absorptance is an absorptance of 30%, for example (see FIG. 2). In this case, as the low-absorptance material, copper or aluminum, for example, may be used, and copper is used in the present embodiment.

In order to increase the absorptance, the inventors formed an oxide film OM on a surface of copper, and evaluated a relation between the film thickness $\alpha$ of the oxide film OM and the absorptance Y for the laser beam having a near-infrared wavelength. FIG. 3 is a graph based on a test result illustrating a relation between the film thickness $\alpha$ (nm) of the oxide film OM formed on the surface (irradiated surface) of the copper and the absorptance Y (%) of the irradiated surface for the laser beam having a near-infrared wavelength.

In the graph of FIG. 3, the abscissa represents the film thickness $\alpha$ (nm) of the oxide film OM, and the ordinate represents the absorptance (first absorptance) Y1 (%) of the lead frame 62 for a laser beam L when the laser beam was radiated onto the surface 62a of the lead frame 62 (metal member) through the oxide film OM.

As can be seen in the graph of FIG. 3, in the relation with the film thickness $\alpha$ of the oxide film OM, the first absorptance Y1 has a periodicity in which its local-maximum values a and b (about 60%) and its local-minimum values aa and bb (about 20%) alternately appear with the change of the film thickness $\alpha$ in an increasing direction, and also has a characteristic in which the first absorptance Y1 is local-minimum when the film thickness $\alpha$ of the oxide film OM is zero. In other words, in the entire range of a region where the film thickness exceeds zero and the film thickness increases, the first absorptance Y1 exceeds the absorptance when the film thickness is zero.

In view of this, the inventors found that, the first absorptance Y1 of the oxide film OM formed on the irradiated surface 62a1, having the periodicity in the relation with the film thickness $\alpha$, only needs to be set within a first absorptance range Ar2 corresponding to a first film-thickness range Ar1a in which the film thickness $\alpha$ of the oxide film OM exceeds zero and is smaller than a first local-minimum film-thickness AA. The first local-minimum film-thickness AA corresponds to the first local-minimum value aa that appears as a local-minimum value of the first absorptance Y1 between a first local-maximum film thickness A corresponding to the first local-maximum value a that appears as a local-maximum value of the absorptance Y for the first time and a second local-maximum film thickness B corresponding to the second local-maximum value b that appears as a local-maximum value of the first absorptance Y1 subsequently to the first local-maximum value a.

The inventors thought that it is more preferable to set the first absorptance Y1 within a second absorptance range Ar3 in which the absorptance is equal to or higher than 40% in the first absorptance range Ar2. By this setting, the film thickness $\alpha$ corresponding to the second absorptance range Ar3 ranges from 35 nm to 135 nm, and a sufficient range of the film thickness $\alpha$ can be obtained. Consequently, a first absorptance Y1 of 40% or higher can be stably obtained.

As a condition of the test described above, the metal member was copper as described above. The laser beam L was radiated by a YAG laser, and was a laser beam having a near-infrared wavelength. The oxide film OM was formed in a furnace. Furthermore, the film thickness of the oxide film OM was measured by sequential electrochemical reduction analysis (SERA). Thus, in the present embodiment, it is assumed that the film thickness of the oxide film OM is a film thickness measured by the SERA in all cases.

The SERA is a known film-thickness measuring method. Specifically, to begin with, an electrolytic solution is applied to a metal surface, and a fine current is caused to flow from an electrode to cause reduction reaction. At this time, the film thickness can be computed by measuring the time taken for the reduction because each substance has its own intrinsic reduction potential.

FIG. 4 is a graph illustrating one example of a relation between irradiation time H and the film thickness α of the oxide film OM formed when the laser beam having a near-infrared wavelength is radiated onto a surface of copper at a radiation output Wx, for example.

Figure 5:
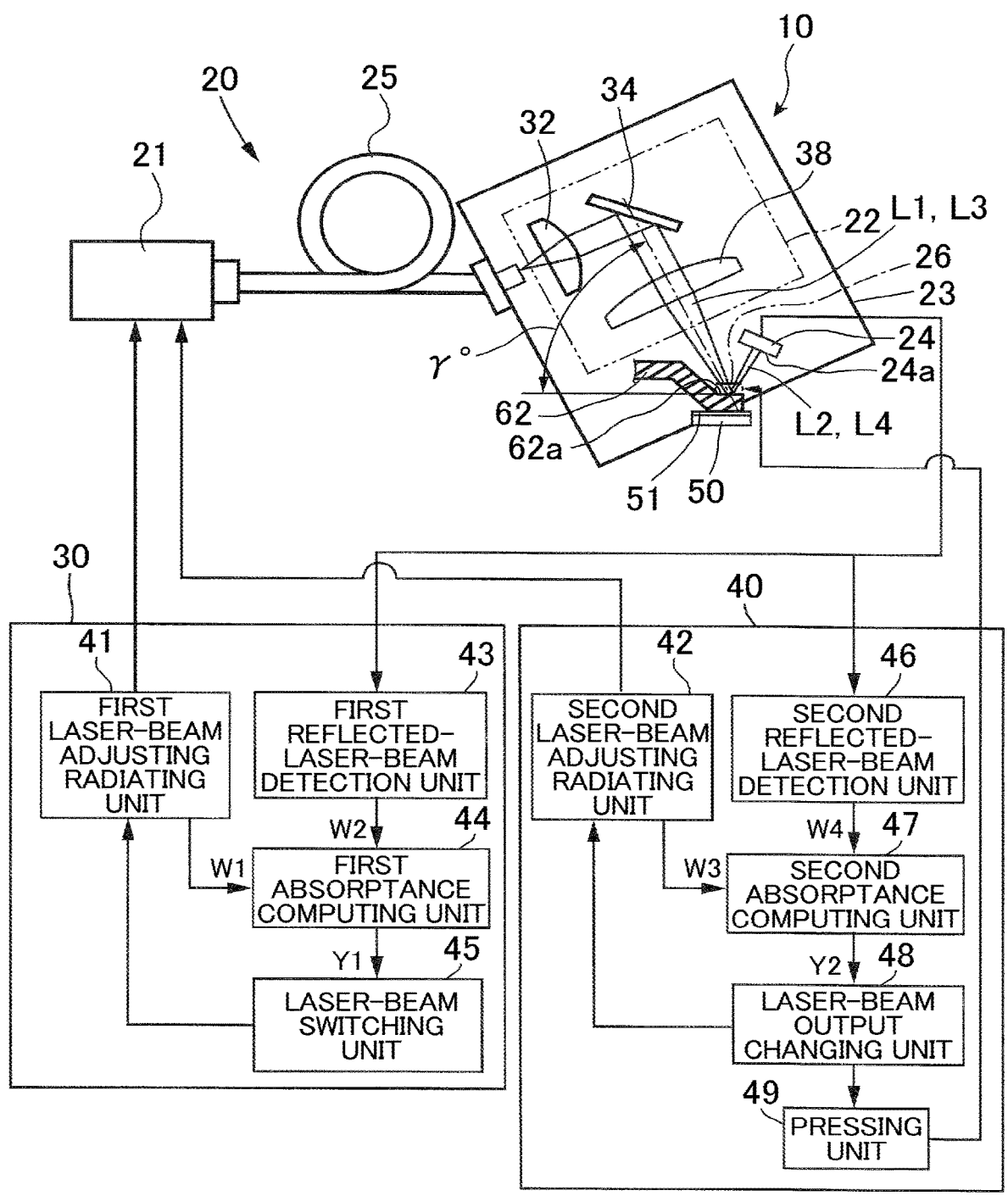
FIG. 5 is a schematic diagram of a bonding device according to a first embodiment.

The following describes a configuration of a bonding device 10 with reference to FIG. 5 and FIG. 1. As depicted in FIG. 5, the bonding device 10 includes a device body 20, an oxide-film forming controller 30, and a heat-bonding controller 40. The oxide-film forming controller 30 controls the device body 20 to radiate an oxide-film-forming laser beam L1 described later in detail onto the surface 62a (irradiated surface 62a1) of the lead frame 62, thereby forming an oxide film OM.

The heat-bonding controller 40 controls the device body 20 to radiate a heat-bonding laser beam L3 described later onto the oxide film OM formed on the irradiated surface 62a1, and to bond the first bonding surface 62b of the lead frame 62 to the second bonding surface 51a of the metal terminal 51.

The device body 20 includes a laser oscillator 21, a laser head 22, a housing 23, a power meter 24, and a pressing device 26. The laser oscillator 21 causes the laser to oscillate with a wavelength and an output corresponding to the type of the laser, thereby generating a desired oxide-film-forming laser beam L1. The wavelength of the oxide-film-forming laser beam L1 is preferably within a range of 0.7 μm to 2.5 μm. In other words, the oxide-film-forming laser beam L1 is preferably a laser beam having a near-infrared wavelength typically exemplified by the YAG laser.

In this case, the laser oscillator 21 can be produced at low cost. Specifically, examples of the oxide-film-forming laser beam L1 that can be used include HoYAG (wavelength: about 1.5 μm), yttrium vanadate (YVO, wavelength: about 1.06 μm), ytterbium (Yb, wavelength: about 1.09 μm), and fiber lasers. The laser oscillator 21 includes an optical fiber 25 through which the oxide-film-forming laser beam L1 caused to oscillate by the laser oscillator 21 is transmitted to the laser head 22.

A first output W1 that is a radiation output of the oxide-film-forming laser beam L1 can be set to any magnitude. However, the first output W1 preferably has an intensity with which an oxide film OM having a film thickness α enabling the absorptance Y1 for the oxide-film-forming laser beam L1 to be obtained can be formed on the irradiated surface 62a1 of the lead frame 62 within a desired period of time.

As depicted in FIG. 5, the laser head 22 disposed in the housing 23 is disposed at a predetermined distance spaced apart from the surface 62a of the lead frame 62 and at a predetermined angle γ° with respect to the surface 62a of the lead frame 62. The laser head 22 includes a collimator lens 32, a mirror 34, and a condenser lens 38. The collimator lens 32 collimates the oxide-film-forming laser beam L1 emitted from the optical fiber 25 into parallel light.

The mirror 34 changes the traveling direction of the collimated oxide-film-forming laser beam L1 such that the oxide-film-forming laser beam L1 enters the condenser lens 38. In the present embodiment, the mirror 34 changes the traveling direction of the oxide-film-forming laser beam L1 by 90 degrees. The condenser lens 38 condenses the parallel oxide-film-forming laser beam L1 entering from the mirror 34.

The power meter 24 detects output of a first reflected laser beam L2. The first reflected laser beam L2 is a laser beam that is generated from the oxide-film-forming laser beam L1 radiated toward the irradiated surface 62a1 when the oxide-film-forming laser beam is reflected by the irradiated surface 62a1. When the oxide film OM is formed on the irradiated surface 62a1, the first reflected laser beam L2 is reflected by the irradiated surface 62a1 through the oxide film OM. The output of the first reflected laser beam L2 is a second output W2. The second output W2 is a value obtained by subtracting an absorbed output Wa that is a portion of the output of the oxide-film-forming laser beam L1 absorbed by the lead frame 62 from the first output W1 that is the radiation output of the oxide-film-forming laser beam L1 (W2=W1−Wa).

The first reflected laser beam L2 is input from an input face 24a of the power meter 24. In other words, the power meter 24 is disposed in any position at any angle so that the first reflected laser beam L2 can be input all from the input face 24a. Because the power meter 24 is a known measuring instrument that measures the output of a radiated laser beam, detailed description thereof is omitted. The output of the first reflected laser beam L2 may be measured not only by the power meter but also by a beam profiler, a CCD sensor, or a CMOS sensor, for example.

The pressing device 26 is a device that presses the upper surface (surface 62a) of the lead frame 62 downward. By this pressing, the pressing device 26 presses the first bonding surface 62b of the lead frame 62 heated up to the bonding temperature Ta against the second bonding surface 51a to bond these surfaces together. The pressure with which the first bonding surface 62b is bonded to the second bonding surface 51a may be set based on verification tests conducted in advance. The pressing device 26 may have any type of structure that can press the first bonding surface 62b heated up to the bonding temperature Ta against the second bonding surface 51a with the pressure P1. The pressure P1 is a pressure with which the first bonding surface 62b heated up to the bonding temperature Ta can be bonded to the second bonding surface 51a.

The oxide-film forming controller 30 includes a first laser-beam adjusting radiating unit 41 (corresponding to a laser-beam adjusting radiating unit), a first reflected-laser-beam detection unit 43, a first absorptance computing unit 44, and a laser-beam switching unit 45.

The first laser-beam adjusting radiating unit 41, which is electrically connected to the laser oscillator 21, controls the wavelength and the output W of the laser beam caused to oscillate and radiated by the laser oscillator 21. Specifically, the first laser-beam adjusting radiating unit 41 causes the laser oscillator 21 to cause the oxide-film-forming laser beam L1 to oscillate and be radiated at the first output W1 onto the irradiated surface 62a1 of the lead frame 62 (first metal member). In this manner, an oxide film OM having a film thickness α that corresponds to the first output W1 and the irradiation time H of the oxide-film-forming laser beam L1 is formed on the irradiated surface 62a1 (see FIG. 4).

The first reflected-laser-beam detection unit 43 is electrically connected to the power meter 24. From the power meter 24, the first reflected-laser-beam detection unit receives data of the second output W2 of the first reflected laser beam L2 input to the power meter 24. The first reflected-laser-beam detection unit 43 transmits the received data of the second output W2 to the first absorptance computing unit 44.

From the first laser-beam adjusting radiating unit 41, the first absorptance computing unit 44 acquires the data of the first output W1 that is an output when the first laser-beam adjusting radiating unit 41 causes the laser oscillator 21 to cause the oxide-film-forming laser beam L1 to oscillate and be radiated onto the irradiated surface 62a1. Based on the first output W1 and the second output W2 that is acquired from the first reflected-laser-beam detection unit 43, the first absorptance computing unit 44 computes a first absorptance Y1 that is the absorptance of the irradiated surface 62$a$1 of the lead frame 62 (first metal member) for the oxide-film-forming laser beam L1. Herein, the first absorptance Y1 is computed in accordance with Y1=(W1−W2)/W1. Data of the computed first absorptance Y1 is transmitted to the laser-beam switching unit 45.

The laser-beam switching unit 45 first determines whether the first absorptance Y1 acquired from the first absorptance computing unit 44 is equal to or higher than 40%, for example. When having determined that the first absorptance Y1 is equal to or higher than 40%, the laser-beam switching unit 45 transmits, to the first laser-beam adjusting radiating unit 41, a command to switch radiation onto the irradiated surface 62$a$1 from the oxide-film-forming laser beam L1 to the heat-bonding laser beam L3.

The following describes the heat-bonding controller 40. As depicted in FIG. 5, the heat-bonding controller 40 includes a second laser-beam adjusting radiating unit 42, a second reflected-laser-beam detection unit 46, a second absorptance computing unit 47, a laser-beam output changing unit 48, and a pressing unit 49. The second laser-beam adjusting radiating unit 42 has the same functions as those of the first laser-beam adjusting radiating unit 41 of the oxide-film forming controller 30. Thus, description thereof is omitted.

The second reflected-laser-beam detection unit 46 is electrically connected to the power meter 24 in the same manner as the first reflected-laser-beam detection unit 43. When the heat-bonding laser beam L3 is radiated onto the irradiated surface 62$a$1 at a third output W3, the second reflected-laser-beam detection unit 46 detects, with the power meter 24, a fourth output W4 that is the output of the second reflected laser beam L4 reflected by the irradiated surface 62$a$1. The oxide-film-forming laser beam L1 and the heat-bonding laser beam L3 are the same type of laser beams, and both are laser beams each having a near-infrared wavelength.

Herein, the incident angle of the heat-bonding laser beam L3 and the reflection angle of the second reflected laser beam L4 with respect to the irradiated surface 62$a$1 are the same as the incident angle of the oxide-film-forming laser beam L1 and the reflection angle of the first reflected laser beam L2 with respect to the irradiated surface 62$a$1, respectively. The second reflected-laser-beam detection unit 46 receives data of the fourth output W4 of the second reflected laser beam L4 acquired by the power meter 24 from the power meter 24. The second reflected-laser-beam detection unit 46 transmits the received data of the fourth output W4 to the second absorptance computing unit 47.

Based on the third output W3 and the fourth output W4 thus acquired, the second absorptance computing unit 47 computes a second absorptance Y2 of the irradiated surface 62$a$1 of the lead frame 62 (first metal member) for the heat-bonding laser beam L3. Herein, the second absorptance Y2 is computed in accordance with Y2=(W3−W4)/W3. For example, as the second absorptance Y2 increases, the fourth output W4 gradually decreases. As a factor in the change and increase of the second absorptance Y2, a possible reason is that the temperature of the irradiated surface 62$a$1 increases, or the irradiated surface 62$a$1 melts, for example. Thus, because the heat-bonding laser beam L3 is absorbed more in the lead frame 62, the temperature-rise speed of the first bonding surface 62$b$ increases. Data of the computed second absorptance Y2 is transmitted to the laser-beam output changing unit 48.

The laser-beam output changing unit 48 adjusts the third output W3 on the basis of the second absorptance Y2 that changes (increases) with the increase in the irradiation time H of the heat-bonding laser beam L3. Specifically, when the second absorptance Y2 increases with lapse of time, the laser-beam output changing unit 48 transmits, to the second laser-beam adjusting radiating unit 42, a command to reduce the third output W3 in accordance with the increase.

The pressing unit 49 is electrically connected to the pressing device 26. When the third output W3 is controlled by the laser-beam output changing unit 48 and then the first bonding surface 62$b$ has reached the bonding temperature Ta, the pressing unit 49 controls the pressing device 26 to press the upper surface (surface 62$a$) of the lead frame 62 downward with the pressure P1. Thus, the first bonding surface 62$b$ is pressed against and bonded to the second bonding surface 51$a$. The pressure P1 for this pressing may be set based on verification tests conducted in advance as described above.

Figure 6A:
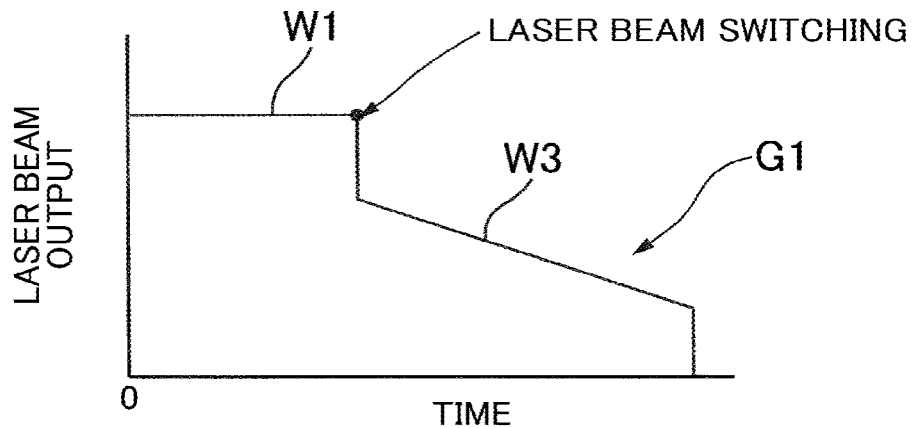
FIG. 6A is a graph G1 illustrating a relation between the radiation output of the oxide-film-forming laser beam and a heat-bonding laser beam and time.
Figure 6B:
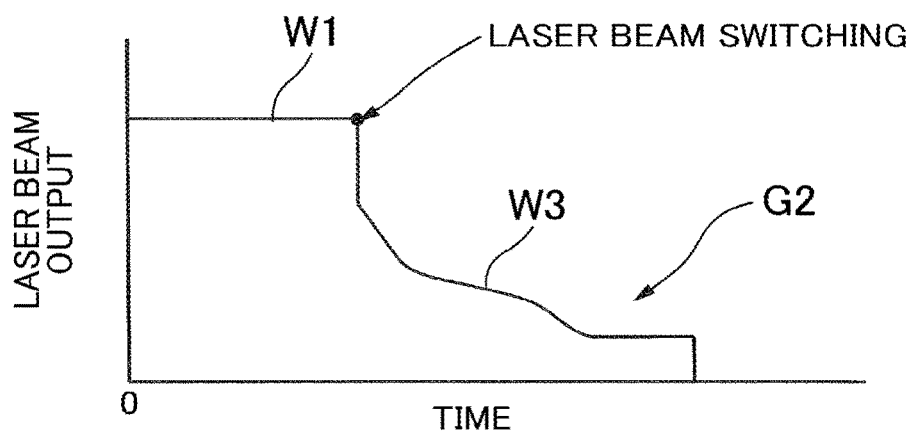
FIG. 6B is a graph G2 illustrating a relation between the radiation output of the oxide-film-forming laser beam and the heat-bonding laser beam and time.
Figure 6C:
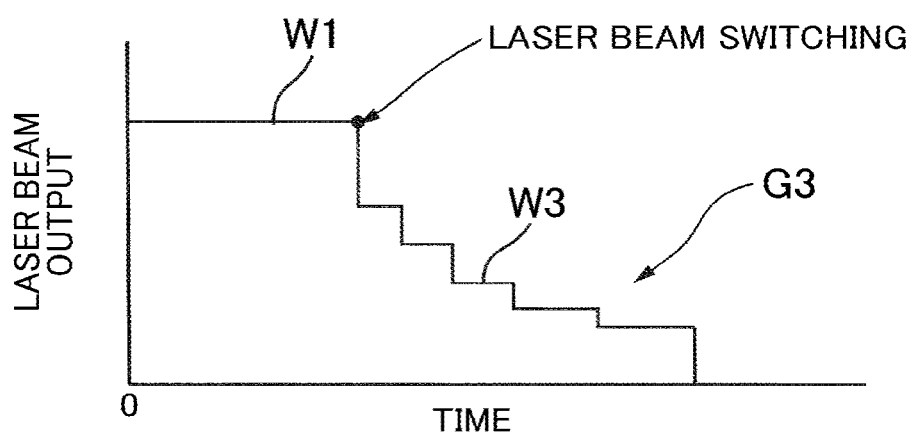
FIG. 6C is a graph G3 illustrating a relation between the radiation output of the oxide-film-forming laser beam and the heat-bonding laser beam and time.

Herein, the laser-beam output changing unit 48 may adjust the third output W3 in any optional manner. For example, as depicted in the graph G1 of FIG. 6A illustrating a relation between the first and third outputs W1 and W3 and elapsed time, the third output W3 may be reduced linearly. Alternatively, as depicted in the graph G2 of FIG. 6B, the third output W3 may be reduced along a curve. Furthermore, as depicted in the graph G3 of FIG. 6C, the third output W3 may be reduced stepwise.

While the third output W3 is being adjusted so as to decrease as described above, the first bonding surface 62$b$ is heated until the temperature thereof reaches the predetermined bonding temperature Ta, which allows the temperature of the first bonding surface 62$b$ to be easily kept at the bonding temperature Ta near the melting point. Consequently, because of the reason described above, excellent bonding having high bonding strength can be easily obtained in the solid-phase diffusion bonding.

Figure 7:
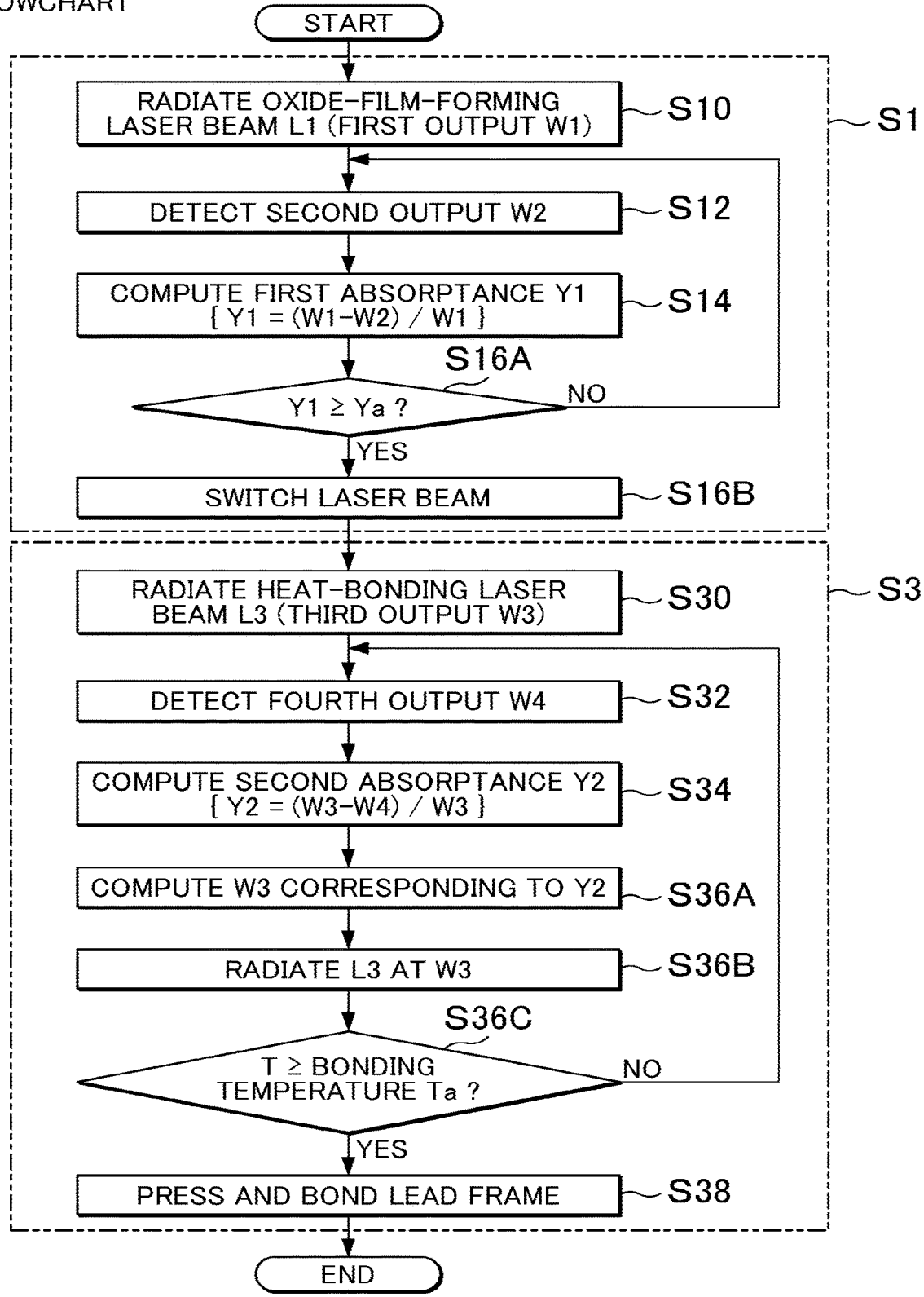
FIG. 7 is a flowchart of a bonding method according to the embodiment.
Figure 8:
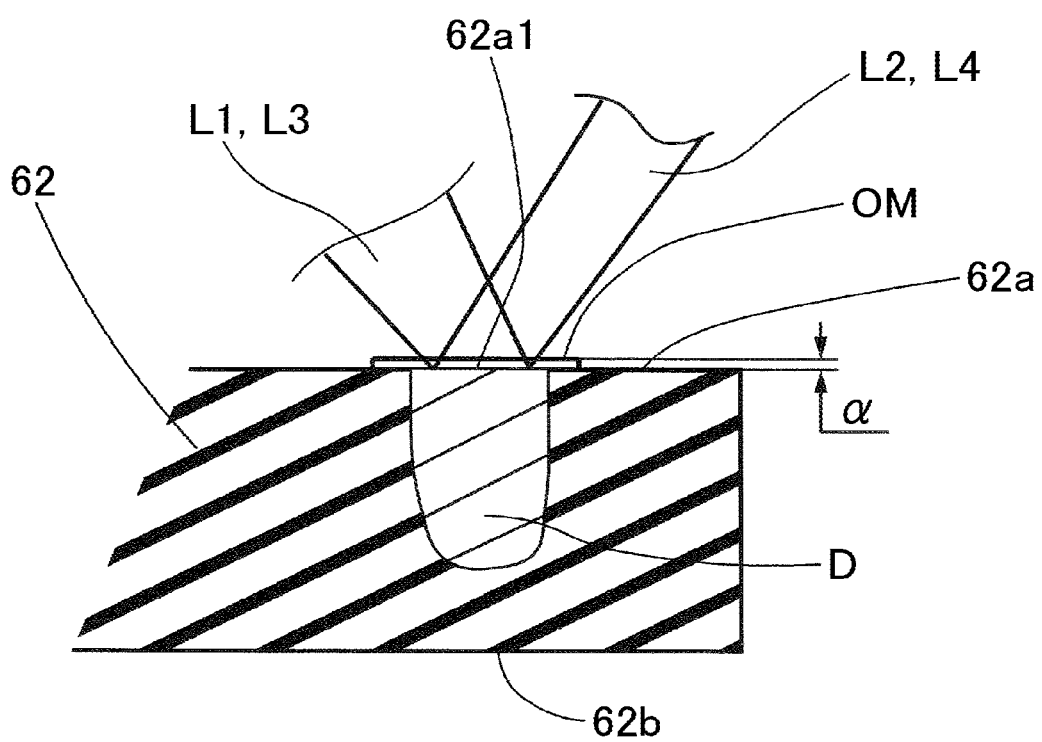
FIG. 8 is a conceptual diagram illustrating a state in which a metal member is heated from its surface by irradiation with a laser beam.

The following describes a bonding method using the bonding device 10 with reference to the flowchart in FIG. 7 and FIG. 8. As depicted in the flowchart in FIG. 7, the bonding method includes an oxide-film-thickness adjusting step S1 and a heat bonding step S3. The oxide-film-thickness adjusting step S1 includes an oxide-film forming step S10, a first reflected-laser-beam detection step S12, a first absorptance computing step S14, and laser-beam switching steps S16A and S16B. The heat bonding step S3 includes a laser-beam adjusting radiating step S30, a second reflected-laser-beam detection step S32, a second absorptance computing step S34, laser-beam output changing steps S36A, S36B, and S36C, and a pressing step S38.

At the oxide-film forming step S10 of the oxide-film-thickness adjusting step S1, when a start button (not depicted) of the bonding device 10 is depressed by an operator, for example, the first laser-beam adjusting radiating unit 41 causes the laser oscillator 21 to causes the oxide-film-forming laser beam L1 to oscillate and be radiated from the laser head 22 onto the surface 62$a$ (irradiated surface 62$a$1) of the lead frame 62 (first metal member). By this radiation, on the irradiated surface 62$a$1, an oxide film OM having a film thickness α corresponding to the first output W1 and the irradiation time H of the oxide-film-forming laser beam L1 is formed.

At the irradiated surface 62$a$1, the oxide-film-forming laser beam L1 is reflected as the first reflected laser beam L2 in a direction depicted in FIG. 1. At this time, at the irradiated surface 62$a$1, an output (Wa) that is a portion of the first output W1 of the oxide-film-forming laser beam L1 is absorbed, and the first reflected laser beam L2 is reflected at the remaining second output W2.

At the first reflected-laser-beam detection step S12, the first reflected-laser-beam detection unit 43 detects the second output W2 of the first reflected laser beam L2 with the power meter 24. The first reflected-laser-beam detection unit 43 transmits data of the detected second output W2 to the first absorptance computing unit 44.

At the first absorptance computing step S14, the first absorptance computing unit 44 acquires data of the first output W1 of the oxide-film-forming laser beam L1 from the first laser-beam adjusting radiating unit 41. Based on the first output W1 and the second output W2 that is acquired from the first reflected-laser-beam detection unit 43, the first absorptance computing unit 44 computes the first absorptance Y1 that is the absorptance of the irradiated surface 62a1 (first metal member) for the oxide-film-forming laser beam L1 in accordance with Y1=(W1−W2)/W1.

At the laser-beam switching step S16A, the laser-beam switching unit 45 first determines whether the first absorptance Y1 is equal to or higher than an absorptance Ya (e.g., 40%) that corresponds to a predetermined absorptance. If it is determined that the first absorptance Y1 is equal to or higher than 40%, at the laser-beam switching step S16B (in the oxide-film-thickness adjusting step S1), the laser-beam switching unit 45 transmits a command to switch the laser beam to the first laser-beam adjusting radiating unit 41. In response to the command, the first laser-beam adjusting radiating unit 41 switches the radiation onto the irradiated surface 62a1 from the oxide-film-forming laser beam L1 to the heat-bonding laser beam L3. However, if the laser-beam switching unit 45 determines that the first absorptance Y1 is lower than 40%, the process returns to the first reflected-laser-beam detection step S12. Subsequently, the processes of S12 to S16A are repeated until it is determined at the laser-beam switching step S16A that the first absorptance Y1 is equal to or higher than the absorptance Ya.

The following describes the heat bonding step S3. As described above, the heat bonding step S3 includes the laser-beam adjusting radiating step S30, the second reflected-laser-beam detection step S32, the second absorptance computing step S34, the laser-beam output changing step 536A, S36B, and 536C, and the pressing step S38.

The process at the laser-beam adjusting radiating step S30 is almost the same as that at the oxide-film forming step S10 of the oxide-film-thickness adjusting step S1. The second laser-beam adjusting radiating unit 42 causes the laser oscillator 21 to cause the heat-bonding laser beam L3 to oscillate and be radiated at the third output W3 from the laser head 22 onto the irradiated surface 62a1 of the lead frame 62 (first metal member) through the oxide film OM that enables a absorptance of 40% or higher.

At this time, the third output W3 is set to a value smaller than that of the first output W1 that is the output of the radiated oxide-film-forming laser beam L1 (W1>W3). By this setting, rapid temperature rise of the lead frame 62 (first bonding surface 62b) can be restrained. At the irradiated surface 62a1, the second reflected laser beam L4 of the heat-bonding laser beam L3 is reflected in directions depicted in FIG. 1 and FIG. 5.

While passing through or being reflected by the oxide film OM formed such that the first absorptance Y1 becomes 40% or higher, for example, the heat-bonding laser beam L3 is efficiently absorbed in the surface 62a of the lead frame 62, thereby satisfactorily heating the lead frame 62. Specifically, as depicted in FIG. 8, the lead frame is heated such that heat is transferred from the surface 62a toward the back side (first bonding surface 62b) positioned opposite to the surface 62a until the temperature of the first bonding surface 62b finally reaches the bonding temperature Ta. The portion D in FIG. 8 represents an image of lead frame 62 being heated from the surface 62a toward the first bonding surface 62b, and heat transfer is illustrated by a region with oblique lines the thickness of which is different from that of the oblique lines indicating the cross-section of the lead frame 62.

At the second reflected-laser-beam detection step S32, the second reflected-laser-beam detection unit 46 detects the fourth output W4 with the power meter 24. Subsequently, the second reflected-laser-beam detection unit 46 transmits data of the fourth output W4 to the second absorptance computing unit 47.

At the second absorptance computing step S34, based on the third output W3 and the fourth output W4 acquired, the second absorptance Y2 of the irradiated surface 62a1 of the lead frame 62 (first metal member) for the heat-bonding laser beam L3 is computed. Specifically, in the same manner as the first absorptance computing unit 44, based on the third output W3 and the fourth output W4, the second absorptance computing unit 47 computes the second absorptance Y2 that is the absorptance of the irradiated surface 62a1 of the lead frame 62 (first metal member) for the heat-bonding laser beam L3 in accordance with Y2=(W3−W4)/W3.

At the laser-beam output changing step S36A, the laser-beam output changing unit 48 computes the third output W3 corresponding to the second absorptance Y2 that changes with the increase in the irradiation time H of the heat-bonding laser beam L3.

Subsequently, at the laser-beam output changing step S36B, so as to radiate the heat-bonding laser beam L3 at the computed third output W3, command values corresponding to the third output W3 are transmitted to the second laser-beam adjusting radiating unit 42. Specifically, when the second absorptance Y2 increases with elapse of time, the third output W3 is reduced with elapse of time as the second absorptance Y2 increases.

At this time, any manner may be used to reduce the third output W3. For example, the third output may be reduced as depicted in the graphs G1 to G3 of FIG. 6A to FIG. 6C described above. By this adjustment, when the heat-bonding laser beam L3 is radiated onto the irradiated surface 62a1 to heat the first bonding surface 62b, the temperature-rise speed of the first bonding surface 62b can be satisfactorily restrained.

In other words, the temperature of the first bonding surface 62b can be easily kept at the bonding temperature Ta near the melting point of the lead frame 62, and high bonding strength can be obtained between the first bonding surface 62b and the second bonding surface 51a.

Subsequently, at the laser-beam output changing step S36C, it is determined whether the temperature T (estimated temperature) of the first bonding surface 62b has been raised to the bonding temperature Ta. At this time, the temperature of the first bonding surface 62b may be estimated based on the third output W3 and the irradiation time H, for example. However, the estimation is not limited to this, and the temperature of the first bonding surface 62b may be estimated based on the temperature of the irradiated surface 62a1 after measuring the temperature of the irradiated surface 62a1 with a thermometer (not depicted) such as an infrared thermometer.

If it is determined that the temperature of the first bonding surface 62b has been raised to the bonding temperature Ta, the process proceeds to the pressing step S38. If it is determined that the temperature of the first bonding surface 62b has not been raised to the bonding temperature Ta, the process returns to the second reflected-laser-beam detection step S32. Subsequently, until it is determined at the laser-beam output changing step S36C that the temperature of the first bonding surface 62b has been raised to the bonding temperature Ta, the processes of S32 to S36C are repeated.

At the pressing step S38, the pressing unit 49 controls the pressing device 26 to press the surface 62a of the lead frame 62 downward with the pressure P1. By this pressing, the first bonding surface 62b in the solid-phase state is bonded to the second bonding surface 51a.

In the present embodiment, description has been made under the assumption that the pressing unit 49 controls to start pressing the lead frame 62 (first metal member) at the pressing step S38 after the temperature of the first bonding surface 62b has reached the predetermined bonding temperature Ta, but the start timing is not limited to this. The pressing performed by the control of the pressing unit 49 may be started at any time within a period after the heat-bonding laser beam L3 is radiated onto the irradiated surface 62a1 to start heating the first bonding surface 62b at the laser-beam adjusting radiating step S30 until the temperature of the first bonding surface 62b reaches the predetermined bonding temperature. The pressing performed by the control of the pressing unit 49 may also be started before the heat-bonding laser beam L3 is radiated onto the irradiated surface 62a1 at the laser-beam adjusting radiating step S30. The pressing performed by the control of the pressing unit 49 may also be started before the oxide-film-forming laser beam L1 is radiated onto the irradiated surface 62a1. In this case, bonding strength can be easily controlled. As a pressing member, any member may be used. The pressure P1 applied herein, which is a pressure that enables the solid-phase diffusion bonding to be achieved, is studied and determined in advance.

In the bonding method described above, a mode has been described in which the first bonding surface 62b and the second bonding surface 51a are bonded together by the solid-phase diffusion bonding, but the bonding method is not limited to this mode. As an alternative bonding method, the first bonding surface 62b and the second bonding surface 51a may be bonded together after being heated until the state thereof is changed into the liquid-phase state (melted state). In this case, in the heat bonding step S3, the second reflected-laser-beam detection step S32, the second absorptance computing step S34, the laser-beam output changing steps S36A to S36C, and the pressing step S38 may be omitted. The third output W3 of the heat-bonding laser beam L3 at the laser-beam adjusting radiating step S30 may be the same in magnitude as the first output W1 of the oxide-film-forming laser beam L1. The third output W3 may be greater than the first output W1. Thus, bonding between the first bonding surface 62b and the second bonding surface 51a can be completed in a shorter time.

At the oxide-film-thickness adjusting step S1 of the bonding method described above, the predetermined absorptance Ya is set based on the graph of FIG. 3 illustrating a relation between the film thickness α and the first absorptance Y1 of the oxide film OM. However, the setting is not limited to this. The absorptance Ya may be simply set to a desired absorptance, not based on the graph of FIG. 3. It should be noted herein that, when the film thickness α of the oxide film OM is small, the first absorptance Y1 with respect to the film thickness α of the oxide film OM has a characteristic in which a local-maximum value and a local-minimum value alternately appear. Thus, when the desired absorptance is excessively high exceeding the local-maximum value, there are cases in which the absorptance Ya cannot be set. In view of this, the setting needs to be made.

In the bonding method described above, it is assumed that the absorptance Ya used as a criterion for the determination on whether the first absorptance Y1 is equal to or higher than the absorptance Ya at the laser-beam switching step S16A (oxide-film-thickness adjusting step S1) is set to 40%. However, the setting is not limited to this. The absorptance Ya may be set to 60% that is the first local-maximum value a in the graph of FIG. 3. In this case, the corresponding film thickness α of the oxide film OM is limited to the point A, which makes control thereof difficult, but the maximum absorptance can be obtained. In this case, at the heat bonding step S3, the heat-bonding laser beam L3 is absorbed in the lead frame 62, and the first bonding surface 62b is heated up to the bonding temperature Ta in a shorter time. In the graph of FIG. 3, the absorptance Ya may be set within the first absorptance range Ar2 (about 20% to 60%) corresponding to the first film-thickness range Ar1a. In this case also, reasonable effects can be obtained.

In the bonding method described above, it is assumed that the film thickness α of the oxide film OM corresponding to the absorptance Ya as a criterion for the determination of the first absorptance Y1 at the laser-beam switching step S16A (oxide-film-thickness adjusting step S1) falls within the first film-thickness range Ar1a. However, the range is not limited to this. The range of the film thickness α of the oxide film OM corresponding to the absorptance Ya may be a wider range in which not only the first film-thickness range Ar1a but also a second film-thickness range Ar1b is added.

In this case, as depicted in FIG. 3, the second film-thickness range Ar1b includes values that are equal to or larger than the first local-minimum film thickness AA. The second film-thickness range Ar1b includes the second local-maximum film thickness B corresponding to the second local-maximum value b that appears as a local-maximum value of the first absorptance Y1 subsequently to the first local-maximum value a. Furthermore, the second film-thickness range Ar1b is a range that is smaller than the second local-minimum film thickness BB corresponding to the second local-minimum value bb that appears as a local-minimum value of the first absorptance Y1, between the second local-maximum film thickness B and a third local-maximum film thickness C corresponding to the third local-maximum value c that appears as a local-maximum value of the first absorptance Y1 subsequently to the second local-maximum value b. By setting the predetermined absorptance Ya so as to correspond to a film-thickness falling within the film-thickness range of the oxide film OM that is a combination of the first film-thickness range Ar1a and the second film-thickness range Ar1b, the possibility that the film thickness α becomes excessively large and the desired film thickness cannot be set is eliminated.

Figure 9:
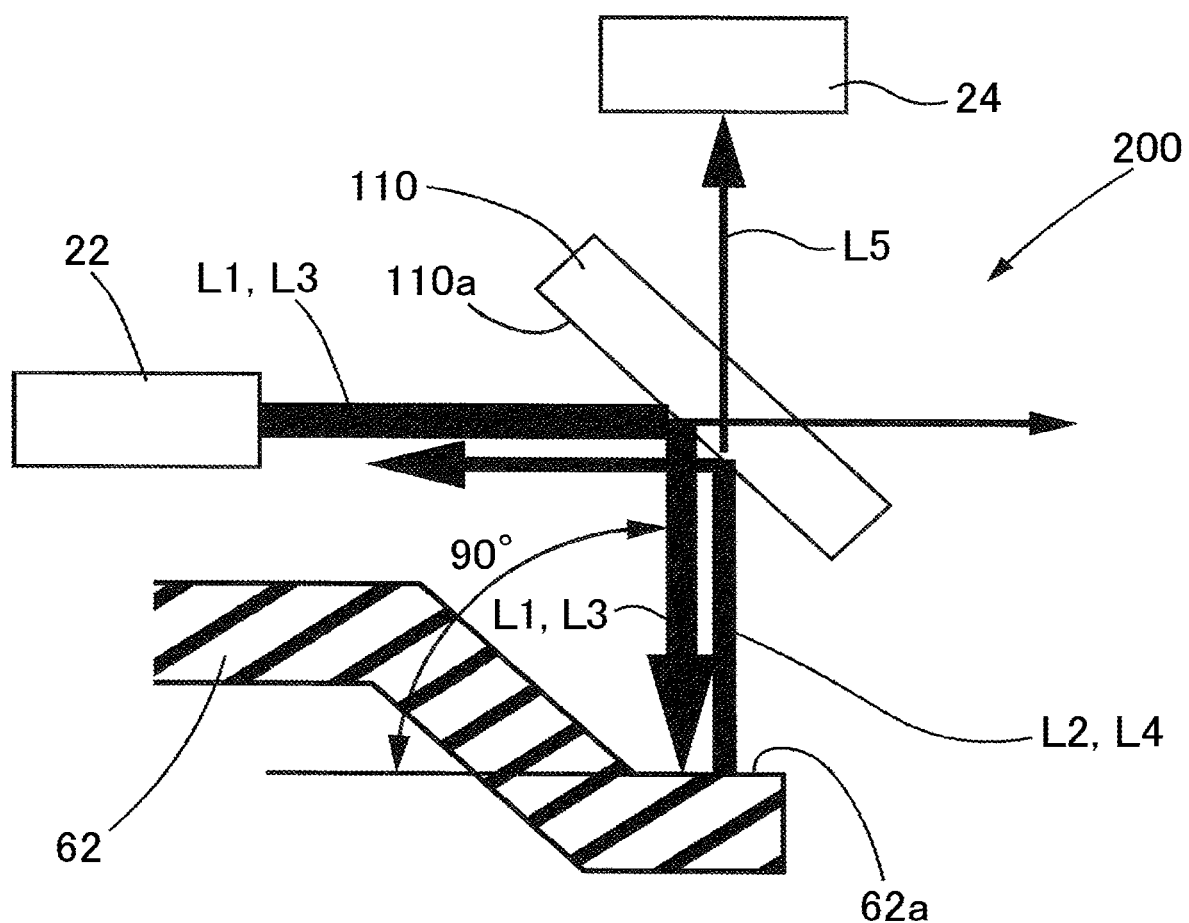
FIG. 9 is a schematic diagram of a device body according to a second embodiment.

The following describes a bonding device according to a second embodiment with reference to FIG. 9. The device body 20 according to the first embodiment described above is configured such that the oxide-film-forming laser beam L1 is radiated onto the surface 62a of the lead frame 62 through the oxide film OM, and then the first reflected laser beam L2 reflected by the irradiated surface 62a1 in the surface 62a of the lead frame 62 is received directly by the power meter 24.

In contrast, as depicted in FIG. 9, a device body 200 according to the second embodiment includes a dichroic mirror 110 on the optical axis of the oxide-film-forming laser beam L1 (and the heat-bonding laser beam L3). The dichroic mirror 110 is an element that reflects light of a certain wavelength region (e.g., a near-infrared wavelength)

and allows light of the other wavelength region to pass therethrough. Not only the dichroic mirror, but also any element having such a characteristic may be used instead.

As described above, the device body 200 is different from the device body 20 according to the first embodiment in that the dichroic mirror 110 is provided on the optical path of the oxide-film-forming laser beam L1 (heat-bonding laser beam L3) and the oxide-film-forming laser beam L1 (heat-bonding laser beam L3) is incident on the surface 62a (irradiated surface 62a1) of the lead frame 62 orthogonally thereto. Thus, only different portions are described, and description of the same portions is omitted. The same components are denoted by the same numerals in the following description.

As depicted in FIG. 9, the dichroic mirror 110 is disposed between the laser head 22 and the surface 62a (irradiated surface 62a1) of the lead frame 62, that is, on the optical axis of the oxide-film-forming laser beam L1 (heat-bonding laser beam L3), so as to be tilted at about 45 degrees with respect to the surface 62a. In the second embodiment in which the dichroic mirror 110 is thus disposed, the oxide-film-forming laser beam L1 (heat-bonding laser beam L3) is radiated toward the dichroic mirror 110 from the laser head 22 that is disposed such that the optical axis of the oxide-film-forming laser beam L1 is horizontal.

Much of the oxide-film-forming laser beam L1 (heat-bonding laser beam L3) that has reached the dichroic mirror 110 is reflected by a mirror surface 110a of the dichroic mirror 110, and part thereof passes through the dichroic mirror. The oxide-film-forming laser beam L1 (heat-bonding laser beam L3) reflected by the mirror surface 110a, the traveling direction of which is changed to a direction orthogonal thereto, is incident on the surface 62a (irradiated surface 62a1) of the lead frame 62 orthogonally to the surface 62a (irradiated surface 62a1).

Subsequently, part of the oxide-film-forming laser beam L1 (heat-bonding laser beam L3) is absorbed in the lead frame 62 from the surface 62a to be converted into heat. The remaining part thereof is reflected by the irradiated surface 62a1, and travels as the first reflected laser beam L2 (second reflected laser beam L4) toward the mirror surface 110a of the dichroic mirror 110 again to reach the mirror surface 110a that is disposed so as to be tilted with respect to the irradiated surface 62a1. At this time, by the mirror surface 110a of the dichroic mirror 110 that the first reflected laser beam L2 (second reflected laser beam L4) has reached, much of the first reflected laser beam L2 (second reflected laser beam L4) is reflected again, and travels parallel to the optical axis of the oxide-film-forming laser beam L1 (heat-bonding laser beam L3) toward the laser head 22.

At the mirror surface 110a that the first reflected laser beam L2 (second reflected laser beam L4) has reached, part of the first reflected laser beam L2 (second reflected laser beam L4) passes through the dichroic mirror 110 to travel upward in FIG. 9. Subsequently, this passing laser beam L5 (first reflected laser beam L2, second reflected laser beam L4) is input to the input face 24a of the power meter 24 disposed above, and the output (second output W2, fourth output W4) of the passing laser beam L5 (first reflected laser beam L2, second reflected laser beam L4) is detected.

By this configuration, similarly to the first embodiment, the first and second absorptances Y1 and Y2 of the irradiated surface 62a1 on which the oxide film OM is formed can be accurately detected. When the first absorptance Y1 has become equal to or higher than the predetermined absorptance Ya, the oxide-film-forming laser beam L1 is switched to the heat-bonding laser beam L3 in the same manner as in the first embodiment. Subsequently, by the same steps as those in the first embodiment, the first bonding surface 62b of the lead frame 62 (first metal member) is bonded to the second bonding surface 51a of the metal terminal 51 (second metal member) on the surface of the semiconductor component 50. By this configuration also, the same effects as those in the first embodiment can be obtained.

In the second embodiment, unlike the first embodiment, the laser head 22 can be disposed horizontally, and thus the configuration is simple. Because the output of the passing laser beam L5 (first reflected laser beam L2, second reflected laser beam L4) input to the power meter 24 is small, a compact power meter can be used, which contributes to cost reduction. Because the oxide-film-forming laser beam L1 (heat-bonding laser beam L3) can be incident on the irradiated surface 62a1 orthogonally thereto, the first and second absorptances Y1 and Y2 can be accurately acquired.

Figure 10:
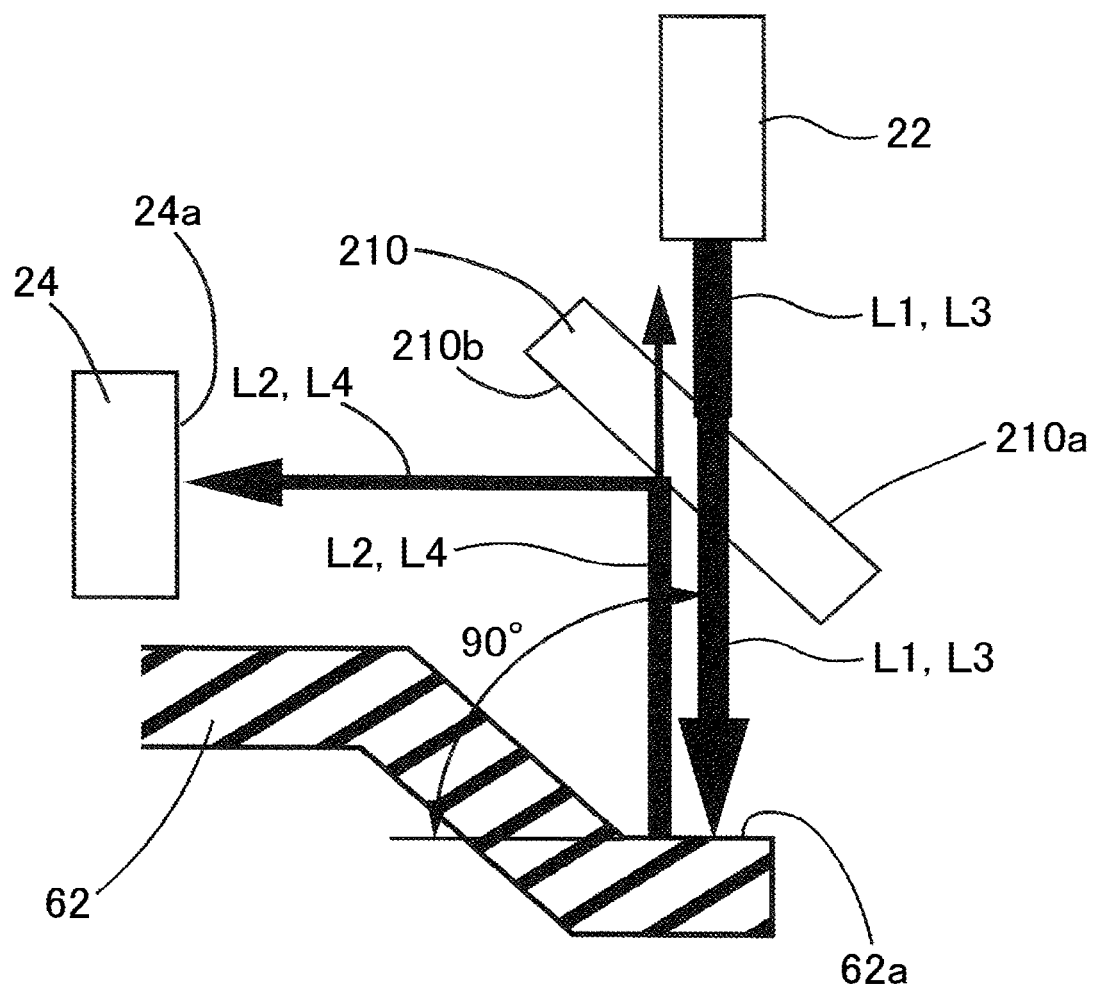
FIG. 10 is a schematic diagram of a device body according to a modification of the second embodiment.

The present invention is not limited to the second embodiment. As a modification of the second embodiment, a dichroic mirror 210, the laser head 22, and the power meter 24 may be disposed as depicted in FIG. 10. In this modification, the dichroic mirror 210 is disposed between the laser head 22 having its optical axis in the vertical direction and the surface 62a of the lead frame 62, that is, on the optical axis of the oxide-film-forming laser beam L1 (heat-bonding laser beam L3) so as to be tilted at about 45 degrees with respect to the surface 62a (irradiated surface 62a1). The dichroic mirror 110 and the dichroic mirror 210 are different in the mode of passing or reflection of the oxide-film-forming laser beam L1 (heat-bonding laser beam L3).

In the modification in which the dichroic mirror 210 is thus disposed, as depicted in FIG. 10, the oxide-film-forming laser beam L1 (heat-bonding laser beam L3) is radiated toward the dichroic mirror 210 from the laser head 22 that is disposed such that the optical axis thereof is vertical.

Much of the oxide-film-forming laser beam L1 (heat-bonding laser beam L3) that has reached the dichroic mirror 210 passes through a mirror surface 210a of the dichroic mirror 210. The oxide-film-forming laser beam L1 (heat-bonding laser beam L3) passing through the mirror surface 210a reaches (is incident on) the surface 62a (irradiated surface 62a1) of the lead frame 62 orthogonally thereto.

Subsequently, part of the oxide-film-forming laser beam L1 (heat-bonding laser beam L3) is absorbed in the lead frame 62 from the surface 62a (irradiated surface 62a1) to be converted into heat. The remaining part thereof is reflected as the first reflected laser beam L2 (second reflected laser beam L4) by the surface 62a (irradiated surface 62a1), and travels again toward a mirror surface 210b of the dichroic mirror 210 to reach the mirror surface 210b that is disposed so as to be tilted at 45 degrees with respect to the surface 62a.

At this time, by the mirror surface 210b of the dichroic mirror 210 that the first reflected laser beam L2 (second reflected laser beam L4) has reached, part of the first reflected laser beam L2 (second reflected laser beam L4) is reflected at right angle, and travels toward the power meter 24. Subsequently, this first reflected laser beam L2 (second reflected laser beam L4) is input to the input face 24a of the power meter 24 disposed on the left in FIG. 10, and the output thereof (second output W2, fourth output W4) is detected. By this configuration, similarly to the first embodiment, the first and second absorptances Y1 and Y2 of the irradiated surface 62a1 on which the oxide film OM is formed can be detected. By this configuration also, the same effects as those in the first embodiment can be obtained.

In this modification, unlike the first embodiment, the laser head 22 can be disposed vertically, and thus the configuration is simple. Similarly to the second embodiment, because the output of the first reflected laser beam L2 (second reflected laser beam L4) input to the power meter 24 is small, a compact power meter can be used, which contributes to cost reduction. Because the oxide-film-forming laser beam L1 (heat-bonding laser beam L3) can be incident on the irradiated surface 62a1 orthogonally thereto, the first and second absorptances Y1 and Y2 can be accurately acquired.

In the above embodiments, description has been made under the assumption that the relation between the first output W1 of the oxide-film-forming laser beam L1 and the third output W3 of the heat-bonding laser beam L3 is given as W1>W3. However, the relation is not limited to this, and the relation between the first output W1 and the third output W3 may be given as W1=W3. Alternatively, the relation between the first output W1 and the third output W3 may be given as W1<W3. In these cases, attention is required to prevent the temperature of the first bonding surface 62b of the lead frame 62 from rising excessively in a short time. If the temperature rises excessively in a short time, the bonding strength may fail to satisfy a predetermined strength value in the case of the solid-phase diffusion bonding. This possibility is eliminated when bonding between the first metal member and the second metal member is performed by welding instead of the solid-phase diffusion bonding.

The bonding device 10 and the bonding method described above have been described in which the heat-bonding laser beam L3 is radiated while the third output W3 of the heat-bonding laser beam L3 is being adjusted so as to decrease. However, the adjustment is not limited to this. The third output W3 may be constant. Alternatively, the heat-bonding laser beam L3 may be radiated while the third output W3 is being adjusted so as to increase. In these cases also, reasonable effects can be obtained.

In the above embodiments, copper that is a low-absorptance material is used as the first metal member. However, the first metal member is not limited to this, and a material other than the low-absorptance material may be used as the first metal member. In this case also, similar effects to those in the above embodiments can be expected.

According to the embodiments described above, the bonding method for a metal member is a bonding method for bonding the first bonding surface 62b of the lead frame 62 (first metal member) to the second bonding surface 51a of the semiconductor component 50 (second metal member) that is in contact with the first bonding surface 62b by radiating the heat-bonding laser beam L3 onto the irradiated surface 62a1 of the lead frame 62 to heat the first bonding surface 62b. The bonding method includes: the oxide-film forming step S10 of radiating the oxide-film-forming laser beam L1 at the first output W1 onto the irradiated surface 62a1 of the lead frame 62, and forming, on the irradiated surface 62a1, an oxide film OM having a film thickness that corresponds to the first output W1 and the irradiation time of the oxide-film-forming laser beam L1; the first reflected-laser-beam detection step S12 of detecting the second output W2 that is an output of the first reflected laser beam L2 generated from the oxide-film-forming laser beam L1 upon being reflected by the irradiated surface 62a1; the first absorptance computing step S14 of computing the first absorptance Y1 of the irradiated surface 62a1 of the lead frame 62 for the oxide-film-forming laser beam L1, based on the first output W1 of the oxide-film-forming laser beam L1 radiated at the oxide-film forming step S10 and the second output W2 of the first reflected laser beam L2 detected at the first reflected-laser-beam detection step S12; the laser-beam switching steps S16A and S16B of switching the oxide-film-forming laser beam L1 radiated onto the irradiated surface 62a1 to the heat-bonding laser beam L3 if it is determined that the first absorptance Y1 is equal to or higher than the predetermined absorptance Ya; and the heat bonding step S3 of, after the switching to the heat-bonding laser beam L3, radiating the heat-bonding laser beam L3 at the third output W3 onto the irradiated surface 62a1 to heat the first bonding surface 62b until the temperature thereof reaches the predetermined bonding temperature Ta, and bonding the first bonding surface 62b to the second bonding surface 51a.

As described above, at the oxide-film forming step S10 in the oxide-film-thickness adjusting step S1, the oxide-film-forming laser beam L1 is radiated onto the irradiated surface 62a1 of the lead frame 62 (first metal member). While the oxide film OM is being formed on the irradiated surface 62a1, the second output W2 of the first reflected laser beam L2 reflected by the irradiated surface 62a1 is detected, and the absorptance of the irradiated surface 62a1 is computed based on the first output W1 of the oxide-film-forming laser beam L1 and the second output W2 of the first reflected laser beam L2. In other words, the actual first absorptance Y1 that is achieved by the oxide film OM formed on the irradiated surface 62a1 is acquired.

When the first absorptance Y1 for the oxide-film-forming laser beam L1 becomes equal to or higher than the absorptance Ya, the oxide-film-forming laser beam L1 is switched to the heat-bonding laser beam L3. The first bonding surface 62b is then heated up to the bonding temperature Ta by radiating the heat-bonding laser beam L3, whereby the first bonding surface 62b is bonded to the second bonding surface 51a. Thus, even if the irradiation time of the oxide-film-forming laser beam L1 is short and only a thin oxide film OM can be formed, the desired first absorptance Y1 can be reliably obtained. Consequently, the heat-bonding laser beam L3 is absorbed by the lead frame 62 (first metal member) with the desired first absorptance Y1, and the first bonding surface 62b of the lead frame 62 is heated up to the predetermined bonding temperature in a short time. Thus, the first bonding surface 62b can be bonded to the second bonding surface 51a in a short time.

According to the embodiments, in the bonding method for a metal member, the bonding temperature Ta is a temperature at which the first bonding surface 62b and the second bonding surface 51a are put in a solid-phase state that occurs at a temperature lower than a temperature of a liquid-phase state and enables bonding therebetween in a solid state. At the heat bonding step S3, the first bonding surface 62b and the second bonding surface 51a in the solid-phase state are pressed against each other in the pressure-bonding direction to be bonded together. Because the first bonding surface 62b and the second bonding surface 51a are bonded together by the solid-phase diffusion bonding in this manner, the temperature of the first bonding surface 62b does not have to be raised to high temperature when the bonding surface is heated. Thus, energy required to raise the temperature can be reduced, which is efficient.

According to the embodiments, the third output W3 of the heat-bonding laser beam L3 radiated at the heat bonding step S3 is lower than the first output W1 of the oxide-film-forming laser beam L1. By this setting, the temperature rise of the first bonding surface 62b of the lead frame 62 heated by radiating the heat-bonding laser beam L3 can be made slow. Thus, the temperature of the first bonding surface 62b can be easily kept at a temperature that is the predetermined bonding temperature Ta near the melting point for a predetermined period of time. This is suitable for performing the solid-phase diffusion bonding that enables bonding having high bonding strength to be obtained by keeping the bonding surface in the solid-phase state near the melting point for a predetermined period of time.

According to the embodiments, in the relation with the film thickness α of the oxide film OM, the absorptance Y has a periodicity in which its local-maximum values a and b and its local-minimum values aa and bb alternately appear with the change of the film thickness α in an increasing direction, and also has a characteristic in which the absorptance Y is minimum when the film thickness α of the oxide film OM is zero. The predetermined absorptance Ya at the laser-beam switching step S16A, having the periodicity in the relation with the film thickness, is set within the first absorptance range Ar2 corresponding to the first film-thickness range Ar1a in which the film thickness α of the oxide film OM exceeds zero and is smaller than the first local-minimum film thickness AA. The first local-minimum film thickness AA corresponds to the first local-minimum value aa that appears as a local-minimum value of the first absorptance Y1 between the first local-maximum film thickness A corresponding to the first local-maximum value a that appears as a local-maximum value of the first absorptance Y1 for the first time and the second local-maximum film thickness B corresponding to the second local-maximum value b that appears as a local-maximum value of the first absorptance Y1 subsequently to the first local-maximum value a.

In this manner, based on the relation between the first absorptance Y1 and the film thickness α of the oxide film OM prepared in advance, the predetermined absorptance Ya used as a criterion for the determination at the laser-beam switching step S16A is set. Thus, possibility of wasting time for, for example, setting the predetermined absorptance Ya to a nonexistent absorptance exceeding the local-maximum values a and b can be eliminated.

According to the embodiments, the predetermined absorptance Ya that is used at the laser-beam switching step S16A as a criterion for determining the first absorptance Y1 is set to 40%. In other words, the first absorptance Y1 is equal to or higher than 40%. Thus, based on the relation between the film thickness α of the oxide film OM and the first absorptance Y1 having a periodicity in which the local-maximum values a and b and the local-minimum value aa alternately appear with the change of the film thickness α in an increasing direction, the film thickness α falls within a predetermined range (35 nm to 135 nm), and thus can be set easily.

According to the embodiments, in the relation between the film thickness α of the oxide film OM and first absorptance Y1 having the periodicity depicted in FIG. 3, the range of the first absorptance Y1 corresponding to the film thickness α of the oxide film OM in the first film-thickness range Ar1a and in the second film-thickness range Ar1b is from 20% to 60%. In this manner, sufficiently high absorptances can be obtained within the wide range of the film thickness α. Thus, although depending on the value of the predetermined absorptance Ya used for determination when it is determined whether to switch the oxide-film-forming laser beam L1, the determination condition is relatively not strict, and thus can be easily satisfied.

According to the second embodiment and the modification, at the oxide-film forming step S10, the oxide-film-forming laser beam L1 is incident on the irradiated surface 62a1 orthogonally thereto. Thus, the absorptance of the irradiated surface 62a1 can be accurately obtained.

According to the embodiments, the bonding method includes: in the heat bonding step S3, the second reflected-laser-beam detection step S32 of detecting the fourth output W4 that is the output of the second reflected laser beam L4 generated from the heat-bonding laser beam L3 radiated at the third output W3 onto the irradiated surface 62a1 upon being reflected by the irradiated surface 62a1; and the second absorptance computing step S34 of computing the second absorptance Y2 of the irradiated surface 62a1 of the lead frame 62 (first metal member) for the heat-bonding laser beam L3, based on the third output W3 and the fourth output W4. At the heat bonding step S3, the third output W3 is adjusted based on the second absorptance Y2 that changes with the increase in the irradiation time H of the heat-bonding laser beam L3.

By this adjustment, the temperature of the first bonding surface 62b can be easily kept at a temperature that is the bonding temperature Ta near the melting point for a predetermined period of time. Thus, as described above, in the solid-phase diffusion bonding, excellent bonding having high bonding strength can be obtained.

According to the embodiments, the bonding device 10 is a bonding device that radiates the heat-bonding laser beam L3 onto the irradiated surface 62a1 of the lead frame 62 (first metal member) to heat the first bonding surface 62b of the lead frame 62, thereby bonding the first bonding surface 62b to the second bonding surface 51a of the metal terminal 51 (second metal member) that is in contact with the first bonding surface 62b. The bonding device 10 includes: the first laser-beam adjusting radiating unit 41 that radiates the oxide-film-forming laser beam L1 onto the irradiated surface 62a1 of the lead frame 62 at the first output W1 to form, on the irradiated surface 62a1, the oxide film OM having a film thickness α corresponding to the first output W1 and the irradiation time H of the oxide-film-forming laser beam L1; the first reflected-laser-beam detection unit 43 that detects the second output W2 that is the output of the first reflected laser beam L2 generated from the oxide-film-forming laser beam L1 upon being reflected by the irradiated surface 62a1; the first absorptance computing unit 44 that computes the first absorptance Y1 of the irradiated surface 62a1 of the lead frame 62 for the oxide-film-forming laser beam L1, based on the first output W1 and the second output W2; the laser-beam switching unit 45 that switches the oxide-film-forming laser beam L1 radiated onto the irradiated surface 62a1 to the heat-bonding laser beam L3 if it is determined that the first absorptance Y1 is equal to or higher than the predetermined absorptance; and the heat-bonding controller 40 that, after the switching to the heat-bonding laser beam L3, radiates the heat-bonding laser beam L3 at the third output W3 onto the irradiated surface 62a1 to heat the first bonding surface 62b until the temperature thereof reaches the predetermined bonding temperature Ta, and bonds the first bonding surface 62b to the second bonding surface 51a. By this configuration, when metal members are bonded together, bonding having the same effects as those that can be obtained in the embodiments can be obtained.

According to the embodiments, the first reflected-laser-beam detection unit 43 detects the second output W2 of the first reflected laser beam L2 with the power meter 24. By this configuration, the first absorptance Y1 of the irradiated surface 62a1 for the oxide-film-forming laser beam L1 can be accurately computed.

What is claimed is:

1. A bonding method for bonding a first bonding surface of a first metal member to a second bonding surface of a second metal member that is in contact with the first bonding surface by radiating a heat-bonding laser beam onto an irradiated surface of the first metal member to heat the first bonding surface, the bonding method comprising:

radiating an oxide-film-forming laser beam at a first output onto the irradiated surface of the first metal member, and forming by virtue of the radiating the oxide-film-forming, laser beam, on the irradiated surface, an oxide film having a film thickness that corresponds to the first output and an irradiation time of the oxide-film-forming laser beam;

detecting a second output that is an output of a first reflected laser beam generated from the oxide-film-forming laser beam upon being reflected by the irradiated surface;

computing a first absorptance of the irradiated surface of the first metal member for the oxide-film-forming laser beam based on the first output of the oxide-film-forming laser beam and the second output of the first reflected laser beam;

determining that the first absorptance is equal to or higher than a predetermined absorptance;

switching the oxide-film-forming laser beam radiated onto the irradiated surface to the heat-bonding laser beam when the first absorptance is equal to or higher than the predetermined absorptance; and after the switching to the heat-bonding laser beam, radiating the heat-bonding laser beam at a third output onto the irradiated surface to heat the first bonding surface until a temperature of the first bonding surface reaches a predetermined bonding temperature, and bonding the first bonding surface to the second bonding surface.

2. The bonding method according to claim 1, wherein
the predetermined bonding temperature is a temperature at which the first bonding surface and the second bonding surface are put in a solid-phase state that occurs at a temperature lower than a temperature of a liquid-phase state and enables bonding therebetween in a solid state, and
the method further comprising pressing the first bonding surface and the second bonding surface in the solid-phase state against each other in a pressure-bonding direction to be bonded together.

3. The bonding method according to claim 1, wherein the third output of the heat-bonding laser beam is lower than the first output of the oxide-film-forming laser beam.

4. The bonding method according to claim 1, wherein
in a relation with the film thickness of the oxide film, the first absorptance has a periodicity in which a local-maximum value and a local-minimum value alternate with a change of the film thickness in an increasing direction, and the first absorptance is minimum when the film thickness of the oxide film is zero,
the predetermined absorptance having periodicity in relation with the film thickness, is set within a range of the first absorptance corresponding to a film-thickness range that is a combination of a first film-thickness range and a second film-thickness range,
the first film-thickness range is a film-thickness range in which the film thickness of the oxide film exceeds zero and is smaller than a first local-minimum film thickness corresponding to a. first local-minimum value of the first absorptance between a first local-maximum film thickness corresponding to a first local-maximum value of the first absorptance at a first time and a second local-maximum film thickness corresponding to a second local-maximum value of the first absorptance at a time subsequent to the first local-maximum value, and the second film-thickness range is a film-thickness range in which the film thickness is equal to or larger than the first local-minimum film thickness, the second local-maximum film thickness is contained, and the film thickness is smaller than a second local-minimum film thickness corresponding to a second local-minimum value of the first absorptance between the second local-maximum film thickness and a third local-maximum film thickness corresponding to a third local-maximum value of the first absorptance at a time subsequent to the second local-maximum value.

5. The bonding method according to claim 4, wherein the range of the first absorptance is from 20% to 60%.

6. The bonding method according to claim 4, wherein the predetermined absorptance is set within the range of the first absorptance corresponding to the first film-thickness range.

7. The bonding method according to claim 4, wherein the predetermined absorptance is set to the first local-maximum value.

8. The bonding method according to claim 4, wherein the predetermined absorptance is set to 40%.

9. The bonding method according to claim 1, wherein the radiating the oxide-film-forming laser beam at the first output includes radiating the oxide-film-forming laser beam is-incident on the irradiated surface orthogonally thereto.

10. The bonding method according to claim 1, further comprising:
detecting a fourth output that is an output of a second reflected laser beam generated from the heat-bonding laser beam radiated at the third output onto the irradiated surface upon being reflected by the irradiated surface;
computing a second absorptance of the irradiated surface of the first metal member for the heat-bonding laser beam based on the third output and the fourth output; and
adjusting the third output based on the second absorptance that changes with increase in an irradiation time of the heat-bonding laser beam.

11. The bonding method according to claim 1, wherein, in a relation with the film thickness of the oxide film, the first absorptance has a periodicity in which a local-maximum value and a local-minimum value alternate with a change of the film thickness in an increasing direction, and the first absorptance is minimum when the film thickness of the oxide film is zero.

12. The bonding method according to claim 11, wherein the predetermined absorptance, having periodicity in relation with the film thickness, is set within a range of the first absorptance corresponding to a film-thickness range that is a combination of a first film-thickness range and a second film-thickness range.

13. The bonding method according to claim 12, wherein the first film-thickness range is a film-thickness range in which the film thickness of the oxide film exceeds zero and is smaller than a first local-minimum film thickness corresponding to a first local-minimum value of the first absorptance.

14. The bonding method according to claim 13, wherein the first local-minimum value of the first absorptance is between a first local-maximum film thickness corresponding to a first local-maximum value of the first absorptance at a first time and a second local-maximum film thickness corresponding to a second local-maximum value of the first absorptance at a time subsequent to the first local-maximum value.

15. The bonding method according to claim 14, wherein the second film-thickness range is a film-thickness range in which the film thickness is equal to or larger than the first local-minimum film thickness.

16. The bonding method according to claim 15, wherein the second local-maximum film thickness is contained.

17. The bonding method according to claim 16, wherein the film thickness is smaller than a second local-minimum film thickness corresponding to a second local-minimum value of the first absorptance.

* * * * *